United States Patent [19]
Sasada et al.

[11] Patent Number: 5,686,836
[45] Date of Patent: Nov. 11, 1997

[54] APPARATUS FOR REDUCING NOISE DUE TO SENSOR VIBRATION DURING MEASUREMENT OF A WEAK MAGNETIC FIELD

[75] Inventors: Ichiro Sasada, Fukuoka; Takao Yamauchi, Kitakyushu, both of Japan

[73] Assignee: Kyushu University, Fukuoka, Japan

[21] Appl. No.: 526,928

[22] Filed: Sep. 12, 1995

[30] Foreign Application Priority Data

Mar. 13, 1995 [JP] Japan .................. 7-052668

[51] Int. Cl.⁶ .................. G01R 33/02; G01R 33/022; A61B 5/05
[52] U.S. Cl. .................. 324/244; 33/356; 128/653.1; 324/207.12; 324/225; 324/247; 324/248
[58] Field of Search .................. 324/225, 244, 324/245, 247, 248, 251–255, 258, 260, 207.12, 207.13; 33/355 R, 356, 357; 128/653.1

[56] References Cited

U.S. PATENT DOCUMENTS 3,557,777  1/1971  Cohen .................. 324/258 X
4,362,992  12/1982 Young et al. .................. 324/247
4,913,152  4/1990  Ko et al. .................. 128/653.1
5,343,707  9/1994  Sata .................. 324/248 X

OTHER PUBLICATIONS

Abe et al.: The 7th Japan Biological Magnet Society Symposium B2-12, 1992), vol. 5, No. 1.

Primary Examiner—Gerard R. Strecker
Attorney, Agent, or Firm—Spencer & Frank

[57] ABSTRACT

An apparatus for measuring a weak magnetic field in a background D.C. magnetic field such as the earth's magnetic field or the like includes a magnetic pickup portion that is supported by a support mechanism which does not impede minute movement in the x- and y-axis direction. A pair of A.C. linear gradient magnetic fields whose directions of gradients are parallel to the x-axis and y-axis, respectively, are used for obtaining reference signals for sensing the position of the pickup portion. The frequencies of the A.C. linear gradient magnetic fields are set to be sufficiently higher than the frequency of the weak magnetic field that is to be measured. The A.C. linear gradient magnetic fields are provided by A.C. current flowing in two pairs of linear conductors which are perpendicular to each other.

18 Claims, 6 Drawing Sheets

FIG. 1

FIG_2

FIG_6

FIG_7

FIG_8(A)

Cylindrical magnetic shield

FIG_8(B)

Gradient magnetic field x component coil

FIG_8(D)

z component coil

FIG_8(C)

Current polarity y component coil

5,686,836

APPARATUS FOR REDUCING NOISE DUE TO SENSOR VIBRATION DURING MEASUREMENT OF A WEAK MAGNETIC FIELD

BACKGROUND OF THE INVENTION

The present invention is directed to an apparatus for measuring a weak magnetic field with high precision by appropriately reducing and removing an unsteady noise component produced when the pickup portion of a magnetometer vibrates in a background magnetic field, in order to separate and measure the weak magnetic field within a larger background magnetic field.

The applicable industrial field of the present invention covers medical diagnosis utilizing magnetism of biological origin, such as biological magnetism measurements, brain magnetic field measurements, and the like, and precision measuring apparatuses, such as brain magnetic field measuring apparatuses and position sensors, nondestructive inspection apparatuses, position tracking apparatuses, and the like.

When one attempts to measure a weak A.C. magnetic field in an environment where there exists a large direct current or a low frequency magnetic field close to a direct current, if the pickup portion of a magnetometer whose sensitivity is directional is slightly vibrated in the background magnetic field, even if the background magnetic field is static, an alternating component having the same frequency as the vibration appears in the output of the magnetometer and becomes a cause of noise or measuring errors.

When the vibration frequency overlaps the magnetic field frequency zone that is to be measured, the vibration frequency becomes noise which impedes the measurement. Particularly, when the vibration is unsteady, filtering of the noise due to the vibration becomes difficult. Such a problem is encountered during measurement of a brain magnetic field (pT order) within a magnetically shielded room. That is, in the residual magnetic field within a magnetic shield, the vibration frequency of the pickup portion of a SQUID (Superconducting Quantuam Interference Device) magnetometer often overlaps the brain magnetic field frequency zone (0.1 Hz–30 Hz). Furthermore the vibration may be unsteady due to human activity, so that it is difficult to remove the noise component by means of a filter. One approach to solving this problem would be to increase the rigidity of the whole apparatus in order to avoid vibration (for example, Abe et al: The 7th Japan Biological Magnet Society Symposium B2-12, 1992), but adequate results have not been obtained.

SUMMARY OF THE INVENTION

The present invention aims to provide an apparatus for measuring a weak A.C. magnetic field with high precision, by reducing or removing unsteady noise components produced by vibration of the pickup portion of a magnetometer in a background magnetic field, in order to separate and measure the weak A.C. magnetic field.

The present invention relates to an apparatus for measuring a weak magnetic field, and includes a magnetometer having a pickup portion that is supported by a support mechanism which does not impede minute movement in the x- and y-axis directions. A.C. linear gradient magnetic fields whose gradient directions are parallel to the x-axis and y-axis, respectively, are used for obtaining reference signals for sensing the position of the pickup portion. The frequencies of the A.C. linear gradient magnetic fields are set to be sufficiently higher than the frequency of the weak magnetic field that is to be measured. The A.C. linear gradient magnetic fields are provided by A.C. currents flowing in two pairs of linear conductors that are perpendicular to each other. The A.C. linear gradient magnetic fields serve as artificially generated reference magnetic fields.

DETAILED DESCRIPTION OF THE INVENTION

Figure 1:
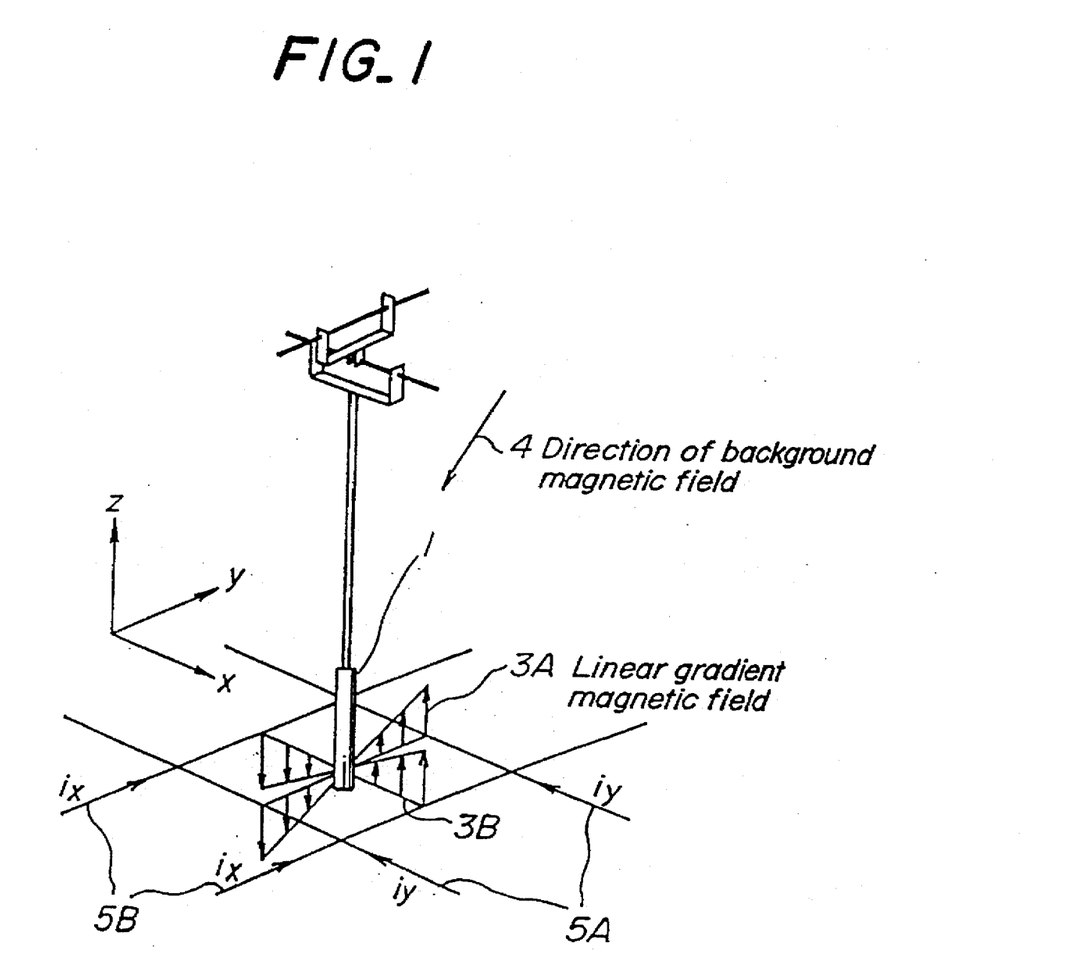
FIG. 1 is a schematic layout for explaining the principle of a magnetic field measuring portion and a method of generating linear gradient magnetic fields of the present invention, and shows the relative positions of a portion for sensing vibration of a pickup portion of a magnetometer (i.e., a magnetic field sensor) that is to measure a low frequency weak magnetic field, and a background D.C. magnetic field (the earth's magnetic field).
Figure 2:
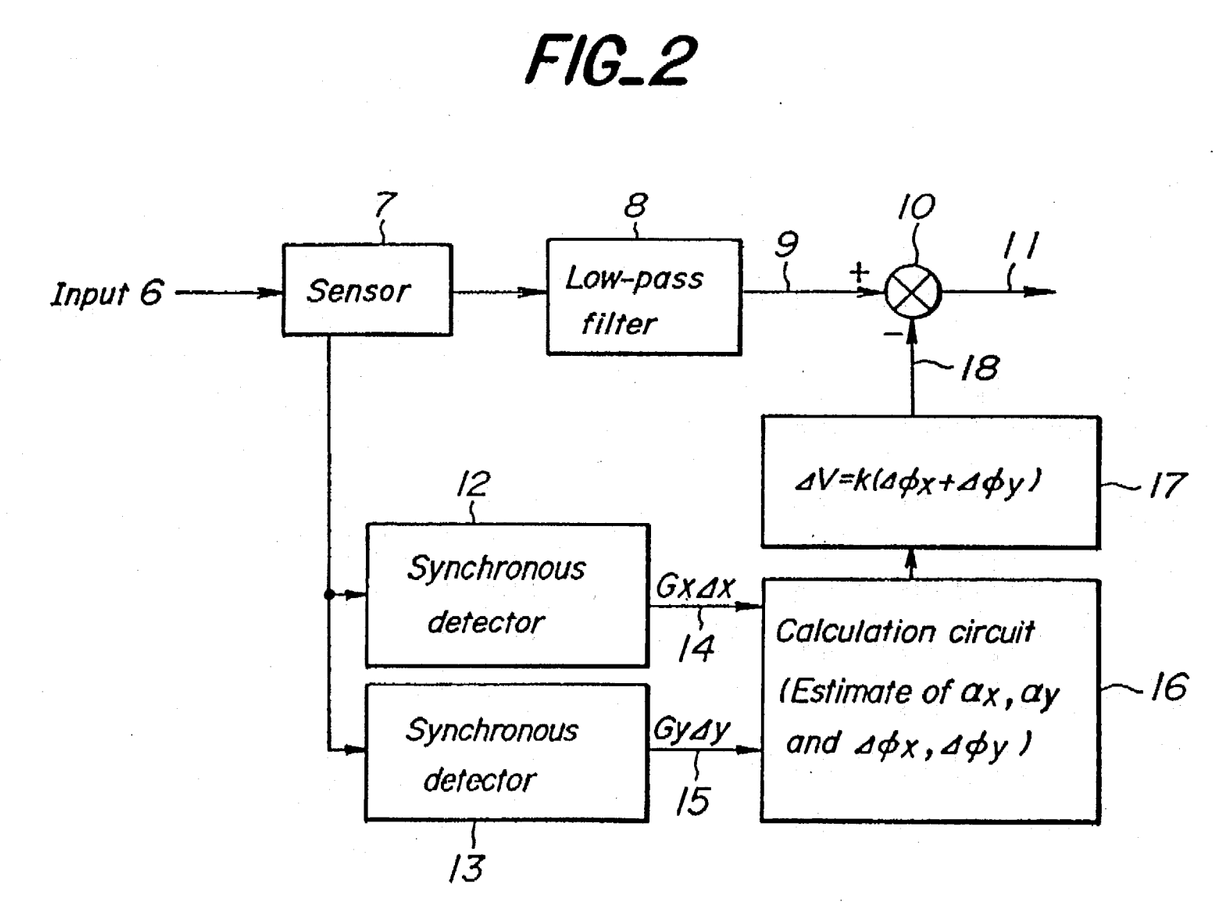
FIG. 2 is a block diagram of a circuit for removing the vibration noise component from the magnetic field component that is to be sensed.

An embodiment of the present invention is shown in FIGS. 1 and 2. The present invention is roughly divided into two constituent elements. FIG. 1 is a diagram showing a portion for sensing vibration of the pickup portion of a magnetometer (i.e., a magnetic field sensor) and a background magnetic field (i.e., earth's magnetic field). The magnetometer may be used to measure a weak low frequency magnetic field. FIG. 2 is a circuit diagram showing a portion for estimating low frequency magnetic noise generated by vibration from information about the vibration mode and information about the background magnetic field distribution, and removing the noise from the measured results by signal treatment. A magnetometer 1 in FIG. 1 is supported by a support mechanism which does not impede minute rotation about the x and y axes, and which is constructed for easily generating vibration noises. This structure will be used for showing the vibration noise reduction effect of the present invention. Here, the pickup portion of the magnetometer 1 is positioned at the lower end of the magnetometer 1 and is oriented in the z-axis direction.

The vibration mode of the pickup portion is identified by assuming a position of the pickup portion and a simple pendulum movement. A.C. linear gradient magnetic fields are used as reference signals for sensing the position of the pickup portion. Their frequencies are set sufficiently higher than the frequency of the magnetic field to be measured so that they do not interfere with the magnetic field to be measured. In the present embodiment, on the assumption that the pickup portion vibrates as a two-dimensional pendulum, a pair of A.C. linear gradient magnetic fields 3A, 3B whose gradients are perpendicular to each other are provided by A.C. current flowing in two pairs of linear conductors 5A, 5B that are perpendicular to each other. In this case, the frequencies of the A.C. linear gradient magnetic fields 3A, 3B are made different. For example, $i_x$ is an A.C. current of $f_1$ Hz and $i_y$ is an A.C. current of $f_2$ Hz, wherein in $f_1 \neq f_2$. The position of the magnetometer 1 in the x-direction and its position in the y-direction are independently sensed by a synchronous detector synchronized with $f_1$ Hz and a synchronous detector synchronized with $f_2$ Hz.

FIG. 2 is a block diagram for explaining the principle of the present invention. An input end 6 of a sensor (i.e., magnetometer) 7 receives a magnetic field that is to be measured, along with the linear gradient magnetic fields of $f_1$ Hz and $f_2$ Hz (which are used for sensing vibration of the sensor) and a background magnetic field which inevitably exists (and which results in vibration noise). These fields are superposed on each other. The sensor 7 outputs a voltage in proportion to the input. If the sensor vibrates even slightly, a part of the background magnetic field is observed as a variable magnetic field having the same vibration frequency as the sensor, which causes vibration noise in the sensor output.

An electric signal corresponding to the A.C. linear gradient magnetic fields, the magnetic field to be measured, and the vibration noise is passed through a low pass filter 8, which cuts off the A.C. linear gradient magnetic field component. The output component from filter 8, representing the magnetic field to be sensed and the vibration noise mixed therewith, is sent to a subtracter 10. On the other hand, components corresponding to the A.C. linear gradient magnetic fields of $f_1$ Hz and $f_2$ Hz include position information, and are separated and detected by two synchronous detectors 12, 13. The $f_1$ Hz component gives an output in proportion to $Gx\Delta x$, and the $f_2$ Hz component gives an output in proportion to $Gy\Delta y$. Here, Gx, Gy are constants which are determined by the spacing and current values of linear conductors 5A, 5B and which are known in advance, so that it is possible to obtain vibration displacements $\Delta x$, $\Delta y$ from a reference position of the sensor from the outputs of the synchronous detectors. A calculation circuit 16 calculates the x, y components $\alpha x$, $\alpha y$ of a normal vector of the sensor 7 (a pickup coil) from the position information $\Delta x$, $\Delta y$ of the pickup coil, and further obtains values of an x component $\Delta \phi x$ and a y component $\Delta \phi y$ of flux linked with the pickup coil by vibration. The values $\Delta \phi x$, $\Delta \phi y$ are sent to the next calculation circuit 17, where a vibration noise component $\Delta V = k(\Delta \phi x + \Delta \phi y)$ (where k is a sensitivity coefficient) is obtained. The calculation circuit 17 sends the estimated value $\Delta V$ of the vibration noise to the subtracter 10, which subtracts the vibration noise from a mixed value of the magnetic field to be sensed and the vibration noise, and obtains the magnetic field to be sensed only. The above series of calculation is as follows.

Figure 5:
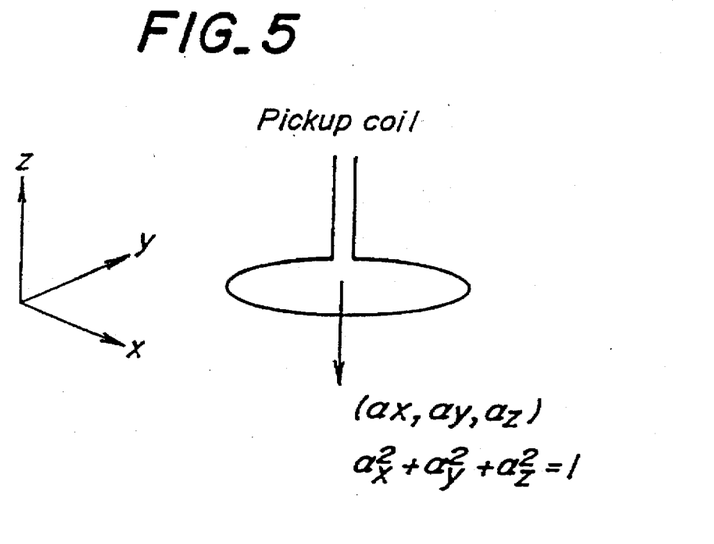
FIG. 5 is a view showing components ($\alpha_x$, $\alpha_y$, $\alpha_z$) of a vector normal to the surface of a pickup coil in the present invention.

As shown in FIG. 5, let the components of the normal vector (wherein the downward direction of the normal vector with respect to the loop surface is positive) of the surface of the pickup coil be $(\alpha x, \alpha y, \alpha z)$, and the components become:

$$\left. \begin{array}{l} \alpha x = \Delta x/L \\ \alpha y = \Delta y/L \\ \alpha z \approx 1 \end{array} \right\} \quad (1)$$

(wherein the pendulum arm length is $L \gg \Delta x$, $\Delta y$) for small vibrations. Let the vector components of the earth's magnetic field be (Hx, Hy, Hz), the vacuum permeability be $\mu_0$, and the pickup coil area be S. Then the output V of a magnetometer having a sensitivity k becomes as follows:

$$\begin{aligned} V &= k \cdot \mu_0 \cdot S \cdot (Hx \cdot \alpha x + Hy \cdot \alpha y + Hz \cdot \alpha z) \quad (2) \\ &= k(\Delta \phi_x + \Delta \phi_y + \phi_z) \end{aligned}$$

Here, $\Delta \phi_x = \mu_0 SH_x \alpha x$, $\Delta \phi_y = \mu_0 SH_y \alpha_y$, and $\phi_z = \mu_0 SH_z \alpha_z \approx \mu_0 SH_z$. The third term is regarded as being an output under a standstill reference state With no vibration, and the output component $\Delta V$ by vibration is written:

$$\Delta V = k(\Delta \phi x + \Delta \phi y).$$

The above explanation is of the case where a magnetic field sensor is provided with the function of separating and sensing an A.C. linear gradient magnetic field for recognizing vibration of the sensor itself, but in a multichannel sensor system, each sensor is fixed with respect to the others, so that it is not necessary to provide said function for all of the sensors. If the function of the present invention is provided in some of a plurality of sensors, or a special few sensors are specified for sensing vibration only and vibration is sensed with high precision, it is possible to cancel the vibration noise by using these sensors.

Figure 3A:
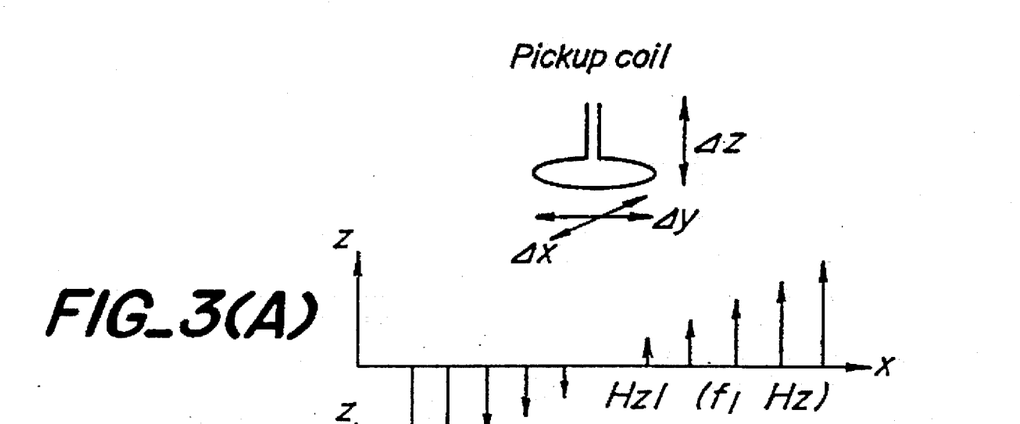
FIG. 3(A) is a view showing an A.C. magnetic field in the z-axis direction and having a linear gradient in the x-axis direction, and shows the principle for sensing vibration according to the present invention.
Figure 3B:
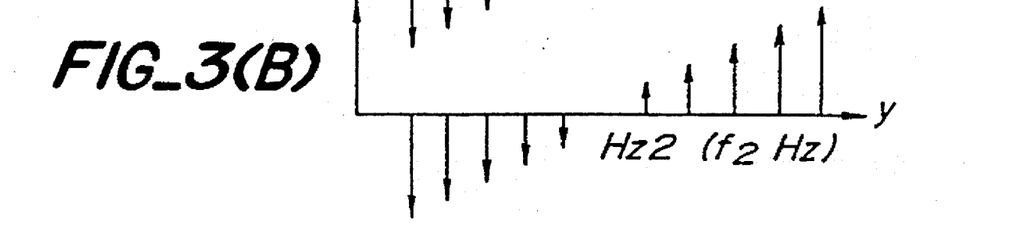
FIG. 3(B) is a view showing an A.C. magnetic field in the z-axis direction and having a linear gradient in the y-axis direction.
Figure 3C:
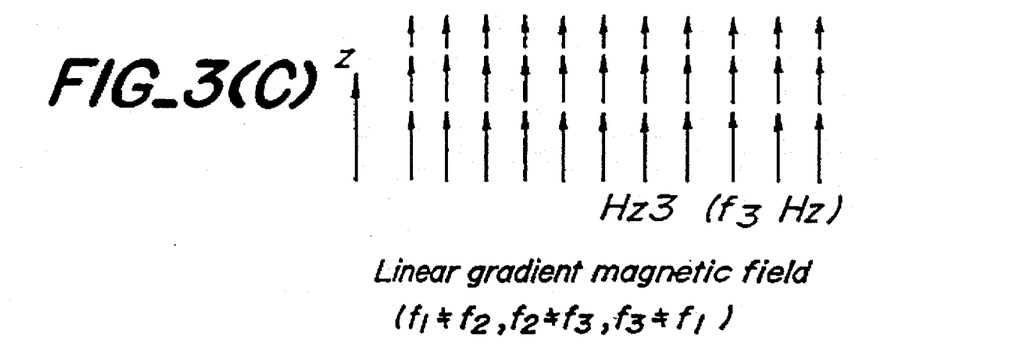
FIG. 3(C) is a view showing an A.C. magnetic field having a linear gradient in the z-axis direction.

FIGS. 3(A), (B), (C) are diagrams showing the vibration mode sensing principle. FIG. 3(A) shows a z-axis direction A.C. current magnetic field having a linear gradient in the x-axis direction, and FIG. 3(B) shows a z-axis direction A.C. current magnetic field having a linear gradient in the y-axis direction. Here, the former frequency is $f_1$ Hz and the latter frequency is $f_2$ and $f_1 \neq f_2$. FIG. 3(C) shows a linear gradient magnetic field having a linear gradient in the z-axis direction (wherein $f_1 \neq f_2$, $f_2 \neq f_3$, $f_3 \neq f_1$).

Here, each gradient magnetic field is fixed with respect to the space coordinate system in which the background magnetic field is represented, such that the gradient directions are parallel to the axes x, y, z of the space coordinate systems x, y, z. For example, when the background magnetic field is earth's magnetic field, the gradient directions of the linear gradient magnetic fields may be fixed so that they are east-west, north-south, and vertical. In the construction of FIG. 1, the magnetic field has a z component, but is not limited thereto. However, in the case of aligning the reference gradient magnetic fields in the same directions as shown, one magnetometer can simultaneously sense each component. The z component of the magnetic field from a magnetic field signal source can simultaneously be measured by this magnetometer. Now, if a pickup coil of the magnetometer is vibrated on the x-y surface in the arrangement of FIG. 1, an amplitude-modulated waveform using each component of $f_1$ and $f_2$ Hz as carrier waveforms appears in the output of the magnetometer 1. The magnitude of the amplitude modulation corresponds to the relative displacement from a reference point (where a vertical line passed through the support crosses the x-y plane). Here, the frequencies of each component differ from each other, so that each component can be separated and sensed by a narrow band synchronous detector (such as a lock-in amplifier). In this case, the detection outputs of each component are proportioned to each component of the relative displacement. That is, when taking the case of the x-axis direction, if the sensor output is ΔV [volt] and its sensitivity is k [volt/gauss], and the magnetic field amplitude gradient is Gx [gauss/cm], the relative displacement Δx is expressed as follows:

$$\Delta x = \Delta V/(kGx) \quad (3)$$

If Δx is negative, the phase of the amplitude modulation is reversed, so as to make ΔV negative. Position resolution depends on the magnetic field amplitude gradient Gx and the resolution Bn of the magnetometer, and the resolution in the x-axis direction is expressed by $\Delta x_n = B_n/Gx$. The same applies to y. This example shows the case of two-dimensional vibration, but in the case of vibration of the magnetometer in the z-axis direction, it is preferable to further superpose an A.C. magnetic field ($f_3$ Hz, $f_3 \neq f_2$, $f_3 \neq f_1$) having a linear gradient in the z-axis direction as shown in FIG. 3(C).

Figure 4:
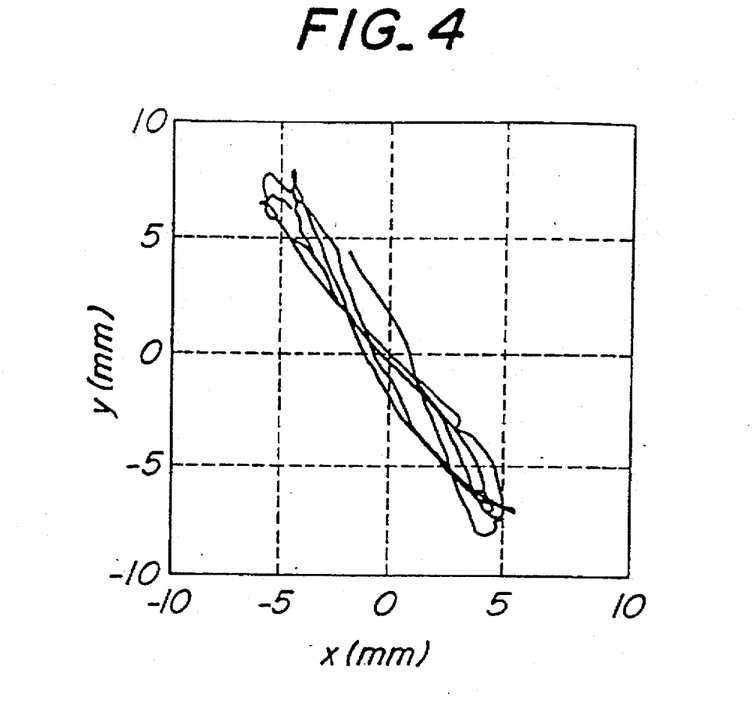
FIG. 4 is a view showing the locus of a vibrating magnetometer pickup portion when $i_x$ is $f_1=400$ Hz, $i_y$ is $f_2=1000$ Hz, and the currents are each 117 mA.

FIG. 4 shows the vibration trace of the pickup portion of the magnetometer 1 when ix is $f_1$=400 Hz, iy is $f_2$=1000 Hz, and the currents are each 117 mA. It is understood that the position is precisely measured by perpendicularly intersecting linear gradient magnetic fields 3A, 3B and that the magnetometer 1 is oriented in the z-axis direction. Here, the length L of an arm acting as the pendulum (i.e., from the lower end of the magnetometer 1 to the support) is about 100 cm.

Figure 6:
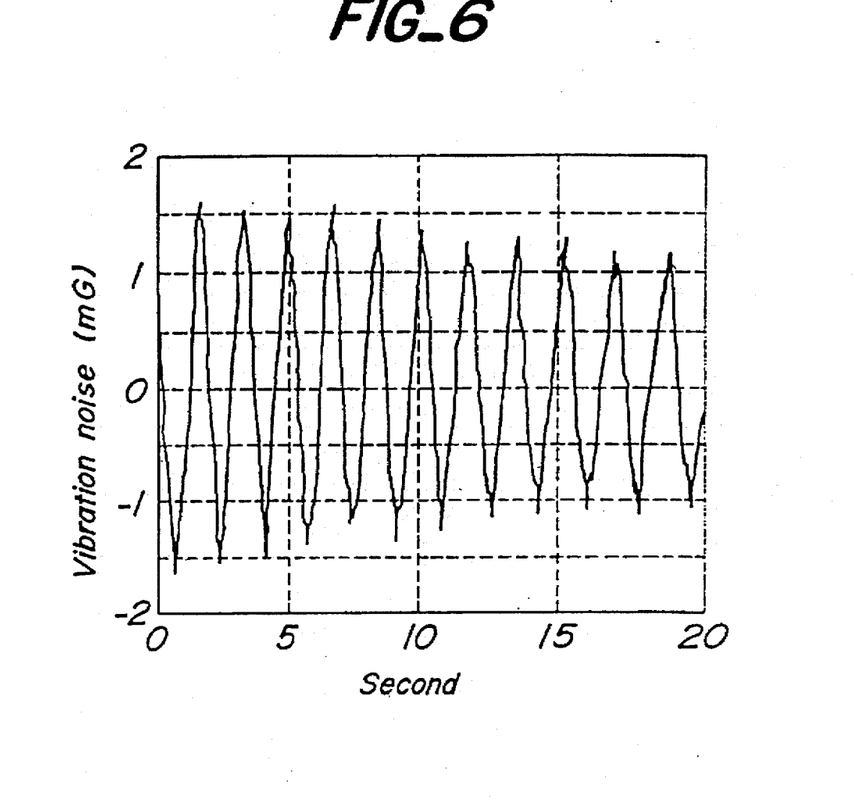
FIG. 6 is a view showing a waveform due to slight vibration of a pickup portion.
Figure 7:
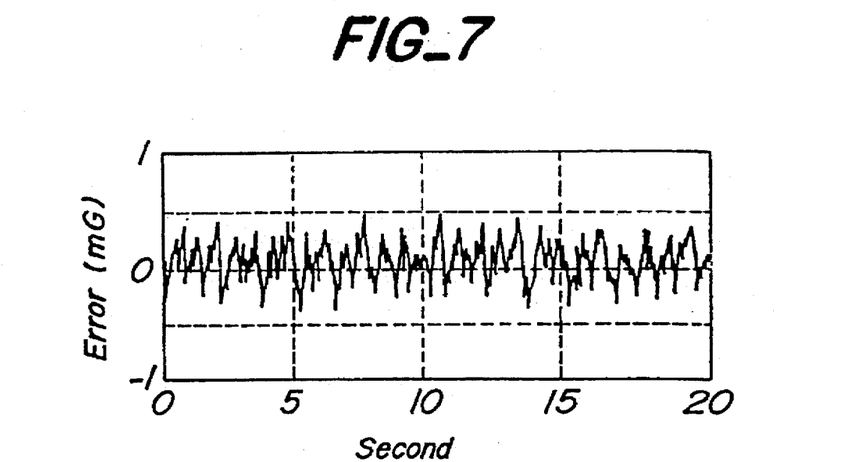
FIG. 7 is a view showing the observed value when the vibration noise component shown in FIG. 6 is subtracted.

The waveform of FIG. 6 is a vibration noise component produced by slight vibration of the pickup portion. Since the vertical component of earth's magnetic field is about 320 mG, ±1.5 mG of the vibration noise component is generated even by slight vibration, so that measurement of a small magnetic field becomes difficult. FIG. 7 shows the value when the estimate of the vibration noise component is subtracted from the observed value.

Figure 8A:
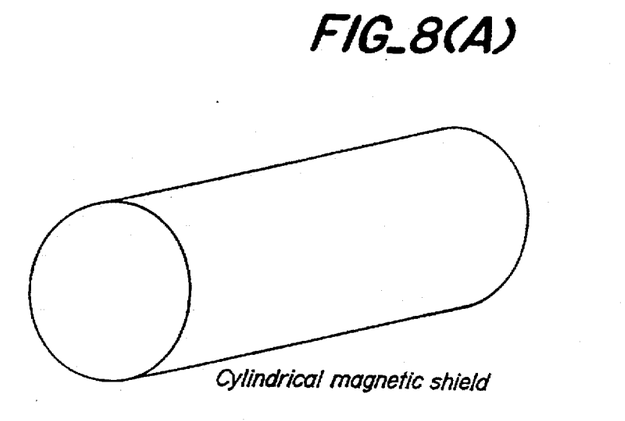
FIG. 8(A) shows a cylindrical magnetic shield.
Figures 8B, 8D:
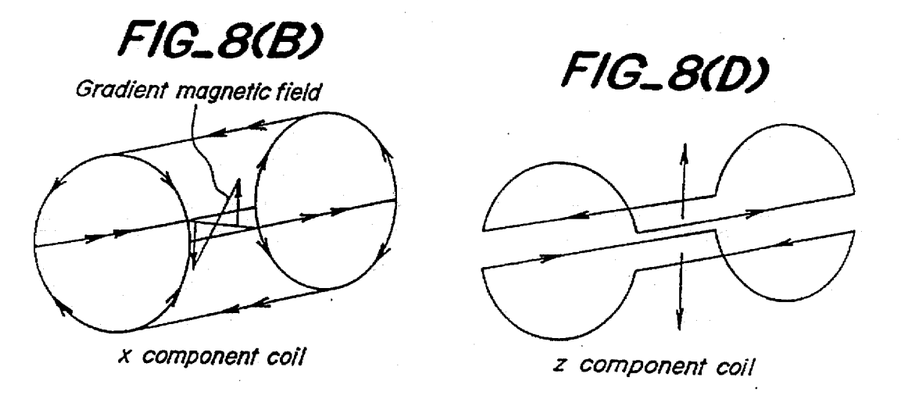
FIG. 8(B) shows an x-component coil.
FIG. 8(D) shows z-component coils, respectively.
Figure 8C:
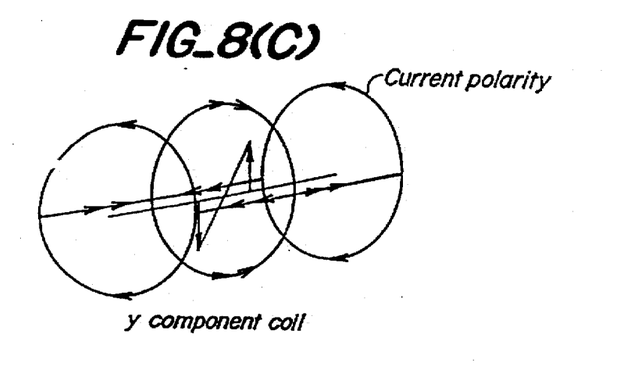
FIG. 8(C) shows an y-component coil.

When an apparatus according to the present invention is constructed within a cylindrical magnetic shield as shown in FIG. 8(A), linear gradient magnetic field generating coils as shown in FIGS. 8(B), 8(C) and 8(D) can be used. FIGS. 8(B), 8(C) and 8(D) also show the distributions of each gradient magnetic field. These coils are fixed to the inner side of the cylinder of FIG. (A), and driven by three different frequencies. Each frequency is made one order of magnitude or more higher than the frequency of the magnetic field to be measured, such as brain magnetic field. Arrow heads in FIGS. 8(B)–8(C) show the polarities of electric currents, and two arrow heads show places having twice the current flow of other places.

The movement of a rigid body has six degrees of freedom, so that a method of sensing all of them is fundamentally preferable, and for this purpose, it is preferable to add pickup portions having directivity and to assemble them to detect the linear gradient magnetic fields and the reference magnetic field. Moreover, a uniform magnetic field can be used for sensing local rotation of a pickup portion. It is a matter of course that frequencies of each magnetic field should be different from each other in these cases.

The present invention has tremendous effect in industry by providing an apparatus for measuring a weak magnetic field with high precision by appropriately reducing and removing an unsteady noise component produced when the pickup portion of a magnetometer vibrates in a background magnetic field. As a result, a low frequency, weak magnetic field such as brain magnetic field or the like within a large background magnetic field such as the earth's magnetic field can be separated and measured.

The present invention can be applied to the fields of medical diagnosis utilizing magnetism of biological origin and precision measurements, and concretely applicable machines and apparatuses are brain magnetic field measuring apparatuses, non-destructive inspection apparatuses, position tracking apparatuses and the like.

We claim:

1. An apparatus for measuring a weak, low frequency A.C. magnetic field in a background magnetic field, comprising:

a magnetic field sensor which generates a sensor signal, the magnetic field sensor being susceptible to vibration, and vibration of the magnetic field sensor in the background magnetic field causing vibratory noise in the sensor signal;

a vibration detector for detecting vibration of the magnetic field sensor; and signal treatment means, responsive to the magnetic field sensor and the vibration detector, for estimating and cancelling the vibrating noise from the sensor signal;

wherein the vibration detector comprises means for generating an A.C. gradient magnetic field having a frequency, and synchronous detector means for detecting amplitude-modulated waves in the sensor signal at the frequency of the A.C. gradient magnetic field.

2. An apparatus for measuring a weak magnetic field as claimed in claim 1, wherein the A.C. gradient magnetic field has a gradient direction which coincides with an expected direction of vibration.

3. An apparatus for measuring a weak magnetic field as claimed in claim 1, wherein the A.C. gradient magnetic field is a first A.C. gradient magnetic field, the first A.C. gradient magnetic field having a gradient direction, wherein the vibration detector further comprises means for generating a second A.C. gradient magnetic field having a gradient direction and having a frequency different from that of the first A.C. gradient magnetic field, the first and second A.C. gradient magnetic fields being superimposed so that their gradient directions intersect, and wherein the synchronous detector means comprises means for detecting amplitude-modulated waves in the sensor signal at the frequency of either of the A.C. gradient magnetic fields.

4. An apparatus for measuring a weak magnetic field as claimed in claim 1, wherein the vibration detector further comprises means for generation of a uniform magnetic field which is combined with the A.C. gradient magnetic field.

5. An apparatus for measuring a weak magnetic field as claimed in claim 3, wherein the A.C. gradient magnetic fields are linear gradient magnetic fields.

6. An apparatus for measuring a weak, A.C. magnetic field in a background D.C. magnetic field, comprising:

a magnetic sensor which generates a sensor signal;

a support mechanism which supports the magnetic sensor and which does not impede minute rotation thereof in an x-axis direction and a y-axis direction of an x, y, z coordinate system, the magnetic field sensor being sensitive in a z-axis direction of the coordinate system; and means for sensing the position of the magnetic sensor, the means for sensing the position including means for generating a pair of A.C. linear gradient magnetic fields having gradient directions and having frequencies which are set higher than the frequency of the weak A.C. magnetic field that is to be measured, the gradient directions of the pair of A.C. linear gradient magnetic fields being perpendicular to the z-axis, with the gradient direction of one of the A.C. linear gradient magnetic fields also being parallel to the x-axis direction and the gradient direction of the other A.C. linear gradient magnetic field also being parallel to the y-axis direction, the means for generating a pair of A.C. linear gradient magnetic fields including two pairs of linear conductors which are perpendicular to each other and which are located adjacent the magnet sensor, A.C. currents being supplied to the linear conductors.

7. An apparatus for measuring a weak magnetic field as claimed in claim 6, wherein vibration of the magnetic sensor in the background D.C. magnetic field causes vibration noise in the sensor signal, wherein the A.C. current supplied to one of the pairs of linear conductors has a frequency $f_1$ and the A.C. current supplied to the other pair of linear conductors has a frequency $f_2$, and wherein the apparatus further comprises:

a low-pass filter which filters the sensor signal, means for synchronously detecting amplitude-modulated waves in the sensor signal at the frequencies $f_1$ and $f_2$ and using the amplitude-modulated waves to obtain an estimate of the vibration noise, and means for subtracting the estimate of the vibration noise from the filtered sensor signal.

8. An apparatus for measuring a weak magnetic field as claimed in claim 6, wherein the means for sensing the position of the magnetic sensor further comprises means for generating a uniform magnetic field which is combined with the A.C. linear gradient magnetic fields.

9. An apparatus for measuring a weak magnetic field as claimed in claim 6, wherein the magnetic sensor comprises a pickup coil.

10. An apparatus for measuring a weak magnetic field as claimed in claim 6, wherein the background D.C. magnetic field includes the earth's magnetic field.

11. An apparatus for measuring a weak magnetic field as claimed in claim 1, wherein the magnetic sensor comprises a pickup coil.

12. An apparatus for measuring an unknown magnetic field in a background magnetic field, comprising:

means for generating an A.C. magnetic field;

a magnetic sensor to sense the unknown magnetic field, the magnetic sensor being located in the A.C. magnetic field, the magnetic sensor generating a sensor signal having a component corresponding to the unknown magnetic field, a noise component corresponding to movement of the sensor in the background magnetic field, and an A.C. component due to the A.C. magnetic field;

a filter to remove the A.C. component of the sensor signal, so as to provide a filtered sensor signal having the noise component and the component corresponding to the unknown magnetic field;

means, responsive to changes in the A.C. component of the sensor signal, for generating a correction signal corresponding to the noise component; and means for subtracting the correction signal from the filtered sensor signal.

13. An apparatus according to claim 12, wherein the means for generating a correction signal comprises means for detecting amplitude modulation of the A.C. component of the sensor signal.

14. An apparatus according to claim 12, wherein the A.C. magnetic field has a plurality of orthogonal components with different frequencies, and the means for generating a correction signal comprises means fork detecting amplitude modulation of the different frequencies.

15. An apparatus according to claim 14, wherein the means for detecting amplitude modulation of the different frequencies comprises a plurality of synchronous detectors.

16. An apparatus according to claim 12, wherein the means for generating an A.C. magnetic field comprises at least one first conductor which extends in a first direction and which carriers current having a first frequency, and at least one second conductor which extends in a second direction and which carries current having a second frequency, the second direction being transverse to the first direction.

17. An apparatus according to claim 16, wherein the second direction is perpendicular to the first direction.

18. An apparatus according to claim 16, wherein the means for generating a correction signal comprises means for detecting amplitude modulation of the first frequency and means for detecting amplitude modulation of the second frequency.

* * * * *